United States Patent
Kim et al.

(10) Patent No.: US 10,026,890 B2
(45) Date of Patent: Jul. 17, 2018

(54) MAGNETORESISTIVE RANDOM ACCESS MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Jong-Uk Kim, Yongin-si (KR); Jung-Moo Lee, Hwaseong-si (KR); Soon-Oh Park, Suwon-si (KR); Jung-Hwan Park, Seoul (KR); Sug-Woo Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 12 days.

(21) Appl. No.: 15/177,597

(22) Filed: Jun. 9, 2016

(65) Prior Publication Data

US 2017/0092847 A1    Mar. 30, 2017

(30) Foreign Application Priority Data

Sep. 30, 2015   (KR) .................... 10-2015-0138000

(51) Int. Cl.

| *H01L 43/08* | (2006.01) |
| *G11C 11/16* | (2006.01) |
| *H01L 27/22* | (2006.01) |
| *H01L 43/02* | (2006.01) |
| *H01L 43/10* | (2006.01) |
| *H01L 43/12* | (2006.01) |

(52) U.S. Cl.
CPC ............ *H01L 43/08* (2013.01); *G11C 11/161* (2013.01); *H01L 27/228* (2013.01); *H01L 43/02* (2013.01); *H01L 43/10* (2013.01); *H01L 43/12* (2013.01)

(58) Field of Classification Search
CPC combination set(s) only.
See application file for complete search history.

(56) References Cited

U.S. PATENT DOCUMENTS

| 6,297,162 | B1* | 10/2001 | Jang ................. H01L 21/3145 |
| | | | 257/E21.269 |
| 8,809,976 | B2 | 8/2014 | Chen et al. |
| 2001/0020723 | A1* | 9/2001 | Gardner ........... H01L 21/28097 |
| | | | 257/368 |
| 2005/0282395 | A1* | 12/2005 | Chang ............... H01L 21/0276 |
| | | | 438/740 |
| 2008/0206895 | A1 | 8/2008 | Asao et al. |

(Continued)

FOREIGN PATENT DOCUMENTS

| JP | 2013-143548 A | 7/2013 |
| KR | 10-2006-0008166 A | 1/2006 |

(Continued)

*Primary Examiner* — Ratisha Mehta
(74) *Attorney, Agent, or Firm* — Lee & Morse P.C.

(57) ABSTRACT

A method of manufacturing a magnetoresistive random access memory device, the method including forming a memory structure on a substrate, the memory structure including a lower electrode, a magnetic tunnel junction structure, and an upper electrode sequentially stacked; forming a first capping layer to cover a surface of the memory structure by a deposition process using a plasma under first conditions; and forming a second capping layer on the first capping layer by a deposition process using a plasma under second conditions different from the first conditions.

22 Claims, 11 Drawing Sheets

(56) References Cited

U.S. PATENT DOCUMENTS

| | | |
|---|---|---|
| 2008/0296740 A1 | 12/2008 | Kawano |
| 2010/0072566 A1 | 3/2010 | Kang et al. |
| 2010/0099271 A1* | 4/2010 | Hausmann ............ C23C 16/345 438/778 |
| 2010/0102407 A1 | 4/2010 | Kajiyama et al. |
| 2011/0114992 A1 | 5/2011 | Schmid et al. |
| 2012/0206535 A1* | 8/2012 | Yamamuro ............ B41J 2/1603 347/20 |
| 2013/0032908 A1 | 2/2013 | Tang et al. |
| 2013/0126995 A1 | 5/2013 | Ogihara |
| 2014/0042508 A1* | 2/2014 | Lee ...................... H01L 27/228 257/295 |
| 2014/0210103 A1 | 7/2014 | Satoh et al. |
| 2015/0017742 A1* | 1/2015 | Lee ................... H01L 21/76816 438/3 |
| 2015/0214120 A1* | 7/2015 | Yang ...................... H01L 21/77 438/154 |

FOREIGN PATENT DOCUMENTS

| | | |
|---|---|---|
| KR | 10-2010-0008164 A | 1/2010 |
| KR | 10-2010-0023141 A | 3/2010 |
| KR | 10-2013-0058227 A | 6/2013 |

\* cited by examiner

MAGNETORESISTIVE RANDOM ACCESS MEMORY DEVICE AND METHOD OF MANUFACTURING THE SAME

CROSS-REFERENCE TO RELATED APPLICATION

Korean Patent Application No. 10-2015-0138000, filed on Sep. 30, 2015, in the Korean Intellectual Property Office, and entitled: "Magnetoresistive Random Access Memory Device and Method of Manufacturing the Same," is incorporated by reference herein in its entirety.

BACKGROUND

1. Field

Example embodiments relate to semiconductor devices and methods of manufacturing the same.

2. Description of the Related Art

A memory cell of a magnetoresistive random access memory (MRAM) device may include a cell structure including a lower electrode, a magnetic tunnel junction (MTJ) structure, and an upper electrode sequentially stacked. A capping layer may be formed on a surface of the cell structure for protecting the cell structure.

SUMMARY

Embodiments may be realized by providing a method of manufacturing a magnetoresistive random access memory device, the method including forming a memory structure on a substrate, the memory structure including a lower electrode, a magnetic tunnel junction structure, and an upper electrode sequentially stacked; forming a first capping layer to cover a surface of the memory structure by a deposition process using a plasma under first conditions; and forming a second capping layer on the first capping layer by a deposition process using a plasma under second conditions different from the first conditions.

The first capping layer may be formed by a first chemical vapor deposition process using a first frequency power, and the second capping layer may be formed by a second chemical vapor deposition process using both of the first frequency power and a second frequency power lower than the first frequency power.

The first capping layer may be formed using a radio-frequency power provided by a pulsed manner, and the second capping layer may be formed using a radio-frequency power by a continuous manner.

Each of the first and second capping layers may be formed using a radio-frequency power provided by a continuous manner.

The first and second capping layers may be formed by a chemical vapor deposition process using a first frequency power, the first capping layer may be formed using a radio-frequency power provided by a pulsed manner, and the second capping layer may be formed using a radio-frequency power by a continuous manner.

The first and second capping layers may be formed by a chemical vapor deposition process using both of a first frequency power and a second frequency power lower than the first frequency power, the first capping layer may be formed using a radio-frequency power provided by a pulsed manner, and the second capping layer may be formed using a radio-frequency power provided by a continuous manner.

The first and second capping layers may be formed in a same process chamber in-situ.

The first capping layer may be a first nitrogen concentration, and the second capping layer may be a second nitrogen concentration greater than the first nitrogen concentration.

The first and second capping layers may be formed using substantially same source gases, and the source gases may be provided under substantially same conditions.

The first and second capping layers may be formed using substantially same source gases provided under different conditions from each other.

The source gases may include at least nitrogen gas, and a flow rate of a first nitrogen gas for forming the first capping layer may be lower than a flow rate of a second nitrogen gas for forming the second capping layer.

Each of the first and second capping layers may include silicon nitride, silicon oxynitride, SiCN, SiOCN, or aluminum nitride.

The method may further include, after forming the second capping layer, forming an insulating interlayer on the second capping layer; and forming a wiring through the insulating interlayer to be electrically connected to the upper electrode.

Embodiments may be realized by providing a method of manufacturing a magnetoresistive random access memory device, the method including forming a memory structure on a substrate, the memory structure including a lower electrode, a magnetic tunnel junction structure, and an upper electrode sequentially stacked; forming a first capping layer to cover a surface of the memory structure by a deposition process using a first frequency power; and forming a second capping layer on the first capping layer by a deposition process using both of the first frequency power and a second frequency power lower than the first frequency power.

The first and second capping layers may be formed in a same process chamber in-situ.

The first capping layer may be formed using a radio-frequency power provided by a pulsed manner, and the second capping layer may be formed using a radio-frequency power provided by a continuous manner.

The first and second capping layers may be formed using a radio-frequency power provided by a continuous manner.

The first capping layer may have a first nitrogen concentration, and the second capping layer may have a second nitrogen concentration greater than the first nitrogen concentration.

Each of the first and second capping layers may include silicon nitride, silicon oxynitride, SiCN, SiOCN, or aluminum nitride.

Embodiments may be realized by providing a magnetoresistive random access memory device, including a memory structure on a substrate, the memory structure including a lower electrode, a magnetic tunnel junction structure, and an upper electrode sequentially stacked; a first capping layer covering a surface of the memory structure, the first capping layer having a first nitrogen concentration; and a second capping layer on the first capping layer, the second capping layer having a second nitrogen concentration greater than the first nitrogen concentration.

The first and second capping layers may include substantially same elements, and concentrations of the elements included in the first and second capping layers may be different from each other.

The first and second capping layers may include silicon and nitrogen, and a first silicon concentration of the first capping layer may be greater than a second silicon concentration of the second capping layer.

Each of the first and second capping layers may include silicon nitride, silicon oxynitride, SiCN, SiOCN, or aluminum nitride.

A density of the second capping layer may be greater than a density of the first capping layer.

An etch rate of the second capping layer may be less than an etch rate of the first capping layer during a wet etching process for the first and second capping layers.

The device may further include an insulating interlayer on the second capping layer; and a wiring through an insulating interlayer, the wiring being electrically connected to the upper electrode.

Embodiments may be realized by providing a method of manufacturing a magnetoresistive random access memory device, the method including forming a memory structure on a substrate, the memory structure including a lower electrode, a magnetic tunnel junction structure, and an upper electrode sequentially stacked; forming a first capping layer to cover a surface of the memory structure; and forming a second capping layer on the first capping layer, a density of the second capping layer being greater than a density of the first capping layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
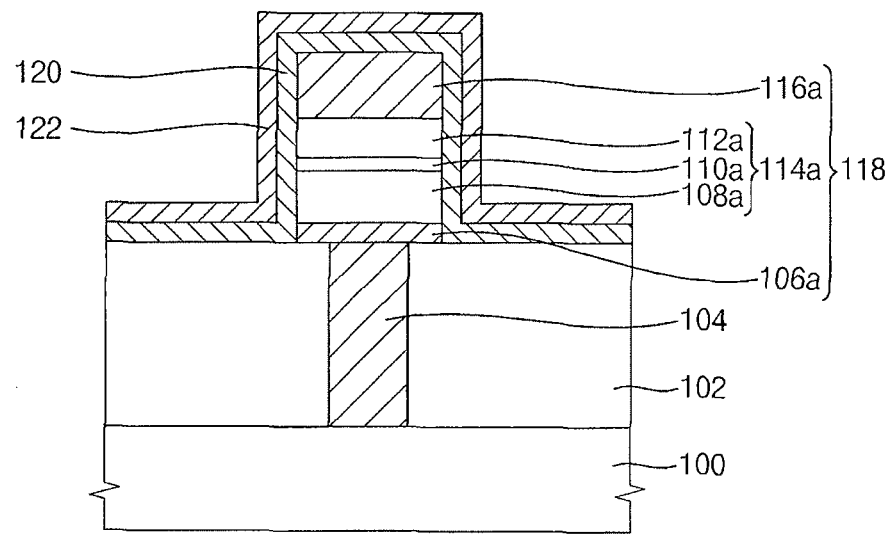
FIG. 1 illustrates a cross-sectional view of an MRAM device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device.

The plurality of device structures may be arranged in an array and/or in a two-dimensional pattern.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of an MRAM device in accordance with example embodiments. Referring to FIG. 1, the MRAM device may include a first insulating interlayer 102, a contact plug 104, and a memory structure 118. The first insulating interlayer 102 may be formed on a substrate 100, and the contact plug 104 may be formed through the first insulating interlayer 102, and may contact a top surface of the substrate 100. The memory structure 118 may be formed on the first insulating interlayer 102, and may contact a top surface of the conductive plug 104. The memory structure 118 may include a lower electrode 106a, an MTJ structure 114a, and an upper electrode 116a sequentially stacked. The memory structure 118 may have a pillar shape. A first capping layer 120 may cover a surface of the memory structure 118 and an upper surface of the first insulating interlayer 102. A second capping layer 122 may be formed on the first capping layer 120.

The substrate 100 may include, for example, a semiconductor material, e.g., silicon, germanium, silicon-germanium, or III-V semiconductor compounds, e.g., GaP, GaAs, or GaSb. In an example embodiment, the substrate 100 may be a silicon-on-insulator (SOI) substrate or a germanium-on-insulator (GOI) substrate.

Various types of elements, e.g., word lines, transistors, diodes, source/drain layers, source lines, and wirings, may be formed on the substrate 100.

The first insulating interlayer 102 may include an oxide, e.g., silicon oxide.

The contact plug 104 may include, for example, a metal, e.g., tungsten, titanium, or tantalum, or a metal nitride, e.g., tungsten nitride, titanium nitride, or tantalum nitride. In an embedment, the contact plug 104 may include, e.g., doped polysilicon.

The lower electrode 106a may include, for example, a metal, e.g., tungsten, titanium, or tantalum, or a metal nitride, e.g., tungsten nitride, titanium nitride, or tantalum nitride. A barrier layer may be further formed on the lower electrode 106a.

The MTJ structure 114a may include a first magnetic pattern 108a, a tunnel barrier pattern 110a, and a second magnetic pattern 112a sequentially stacked.

In example embodiments, the first magnetic pattern 108a may serve as a fixed layer structure having a fixed magnetization direction.

In example embodiments, the first magnetic pattern 108a may include a pinning layer, a lower ferromagnetic layer, an anti-ferromagnetic coupling spacer layer, and an upper ferromagnetic layer sequentially stacked. The pinning layer may include, e.g., iron manganese (FeMn), iridium manganese (IrMn), platinum manganese (PtMn), manganese(II) oxide (MnO), manganese(II) sulfide (MnS), manganese(II) telluride (MnTe), manganese(II) fluoride ($MnF_2$), iron(II) fluoride ($FeF_2$), iron(II) chloride ($FeCl_2$), iron(II) oxide (FeO), cobalt(II) chloride ($CoCl_2$), cobalt(II) oxide (CoO), nickel(II) chloride ($NiCl_2$), nickel(II) oxide (NiO), and/or chromium (Cr). The lower and upper ferromagnetic layers may include, e.g., iron (Fe), nickel (Ni), and/or cobalt (Co). The anti-ferromagnetic coupling spacer layer may include, e.g., Ruthenium (Ru), iridium (Ir), and/or rhodium (Rh).

In example embodiments, the second magnetic pattern 112a may serve as a free layer having a variable magnetization direction. The second magnetic pattern 112a may include, for example, a ferromagnetic material, e.g., Fe, Co, Ni, Cr, or Pt. The second magnetic pattern 112a may further include, e.g., boron or silicon. These materials may be used alone or in a combination thereof. The second magnetic pattern 112a may include, for example, a metal alloy, e.g., CoFe, NiFe, FeCr, CoFeNi, PtCr, CoCrPt, CoFeB, NiFeSiB, or CoFeSiB.

The tunnel barrier pattern 110a may be formed between the first and second magnetic patterns 108a and 112a, such that the first and second magnetic patterns 108a and 112a may not directly contact each other.

In example embodiments, the tunnel barrier pattern 110a may include an insulative metal oxide. For example, the tunnel barrier pattern 119a may include, e.g., aluminum oxide or magnesium oxide.

In an embodiment, various modifications to compositions of the MTJ structure 114a may be possible.

The upper electrode 116a may include, for example, a metal, e.g., tungsten, titanium, or tantalum, or a metal nitride, e.g., tungsten nitride, titanium nitride, or tantalum nitride. For example, the upper electrode 116a may include tungsten.

The first and second capping layers 120 and 122 may include nitrogen. The first capping layer 120 may have a first nitrogen concentration, and the second capping layer 122 may have a second nitrogen concentration higher than the first nitrogen concentration.

The first capping layer 120 may contact, e.g., directly contact, a surface of the memory structure 118. The first capping layer 120 may have a relatively low nitrogen concentration, such that the surface of the memory structure 118 may not be much damaged during forming the first capping layer 120.

The second capping layer 122 may have a compactness or density greater than a compactness or density of the first capping layer 120. The second capping layer 122 may protect the memory structure 118 during performing subsequent processes, while the first capping layer may protect the memory structure 118 during formation of the second capping layer 122. For example, the second capping layer 122 may prevent magnetic materials in the memory structure 118 from being deteriorated due to, for example, a thermal process or penetration of chemicals. The second capping layer 122 may be formed on the first capping layer 120, the second capping layer 122 may not directly contact the memory structure 118, and when the second capping layer 122 is formed, the surface of the memory structure 118 may not be damaged due to the first capping layer thereon, e.g., directly thereon.

The second capping layer 122 may have the density greater than the density of the first capping layer 120, and the second capping layer 122 may have an etch resistance greater than an etch resistance of the first capping layer 120. For example, when the first and second capping layers 120 and 122 are wet etched, the etch rate of the second capping layer 122 may be less than the etch rate of the first capping layer 120.

In example embodiments, each of the first and second capping layers 120 and 122 may include, e.g., silicon nitride, silicon oxynitride, SiCN, SiOCN, or aluminum nitride.

In example embodiments, the first and second capping layers 120 and 122 may include substantially the same elements. In an embodiment, concentrations of the elements included in the first and second capping layers 120 and 122 may be different from each other.

In some example embodiments, the first and second capping layers 120 and 122 may include at least one element different from each other.

In example embodiments, the first and second capping layers 120 and 122 may include silicon and nitrogen, and the first capping layer 120 may have a first silicon concentration greater than a second silicon concentration of the second capping layer 122. For example, the first capping layer 120 may include silicon rich silicon nitride, and the second capping layer 122 may include nitrogen rich silicon nitride.

In example embodiments, each of the first and second capping layers 120 and 122 may be formed by a deposition process using different conditions from each other. These different conditions may include using different frequencies of radio-frequency (RF) power; RF power supplied in different manners, e.g., pulsed at different pulse widths or supplied continuously; different flow rates of the same source gases; different concentrations of the same source gas; and/or different source gases.

Figure 6:
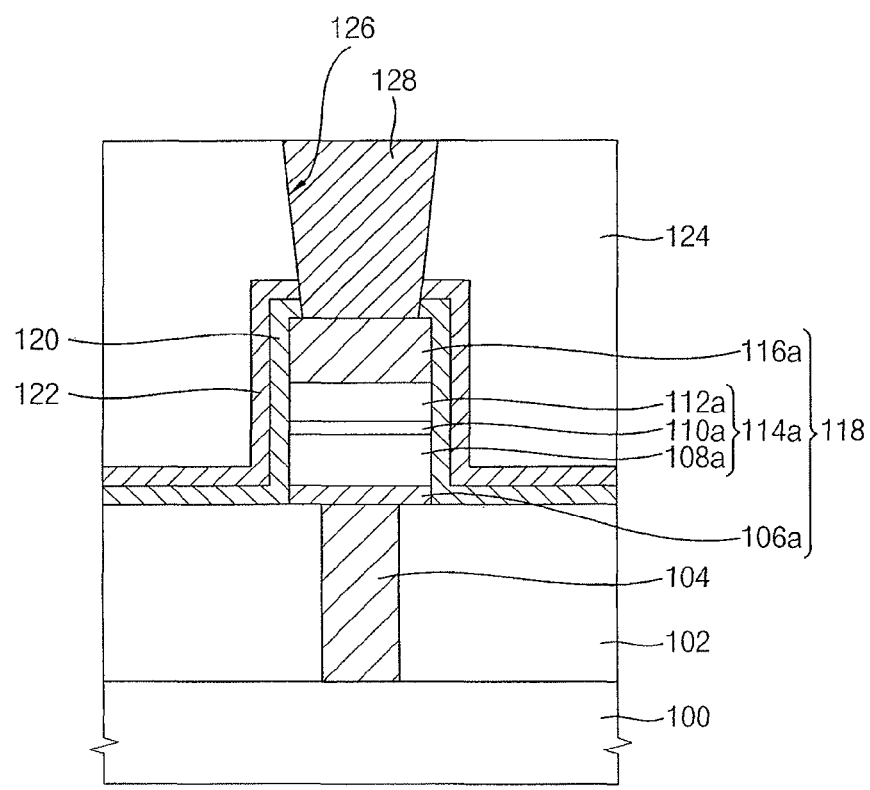

In example embodiments, as shown in FIG. 6, a second insulating interlayer 124 may be further formed on the second capping layer 122, and may cover the memory structure 118. A wiring structure 128 may be formed through the second insulating interlayer 124 and first and second capping layers 120 and 122, and may be electrically connected to the upper electrode 116a, which may form the MRAM shown in FIG. 6.

Figure 2:
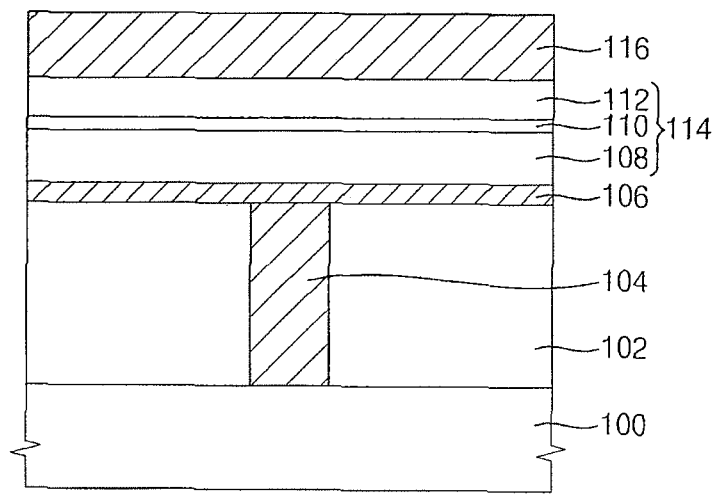
FIGS. 2 to 6 illustrate cross-sectional views of stages of a method of manufacturing the MRAM device in accordance with example embodiments.
Figure 7:
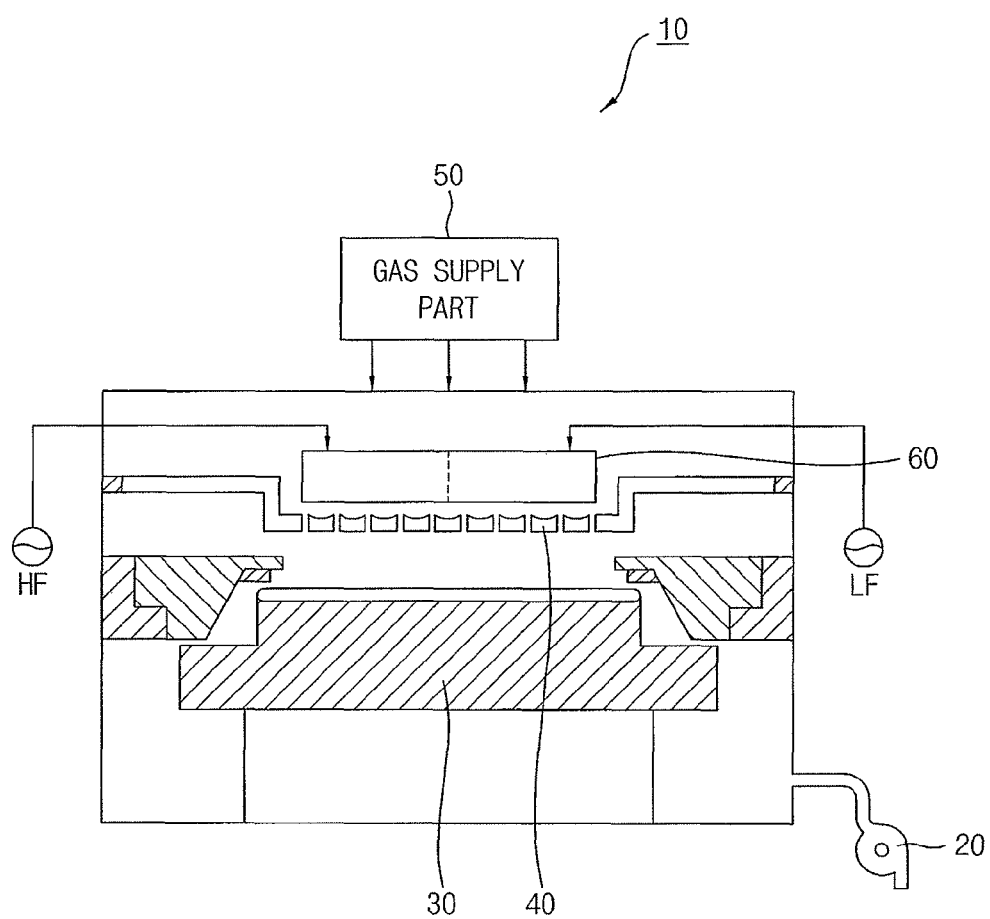
FIG. 7 illustrates a cross-sectional view of a depositing apparatus for forming a first capping layer and a second capping layer in accordance with example embodiments.

FIGS. 2 to 6 illustrate cross-sectional views of stages of a method of manufacturing an MRAM device in accordance with example embodiments. FIG. 7 illustrates a cross-sectional view of a deposition apparatus for forming a first capping layer and a second capping layer in accordance with example embodiments. Referring to FIG. 2, a first insulating interlayer 102 may be formed on a substrate 100, and a contact plug 104 may be formed through the first insulating interlayer 102 to contact a top surface of the substrate 100.

Various types of elements, e.g., word lines, transistors, diodes, source/drain layers, source lines, and wirings, may be formed on the substrate 100.

The first insulating interlayer 102 may be formed of an oxide, e.g., silicon oxide. The first insulating interlayer 102 may be formed by, for example, a chemical vapor deposition (CVD) process, an atomic layer deposition (ALD) process, or a spin coating process.

The contact plug 104 may be formed by forming a first opening through the first insulating interlayer 102 to expose the top surface of the substrate 100, forming a conductive layer on the exposed top surface of the substrate 100 and the first insulating interlayer 102 to fill the first opening, and planarizing an upper portion of the conductive layer until a top surface of the first insulating interlayer 102 may be exposed.

A lower electrode layer 106, an MTJ layer 114, and an upper electrode layer 116 may be sequentially formed on the first insulating interlayer 102 and the conduct plug 104.

The lower electrode layer 106 may be formed of a metal or a metal nitride.

The MTJ layer 114 may include a first magnetic layer 108, a tunnel barrier layer 110, and a second magnetic layer 112 sequentially stacked.

The first magnetic layer 108 may include a pinning layer, a lower ferromagnetic layer, an anti-ferromagnetic coupling spacer layer, and an upper ferromagnetic layer. The pinning layer may be formed of, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic layers may be formed of a ferromagnetic material, e.g., Fe, Ni, and/or Co. The anti-ferromagnetic coupling spacer layer may be formed of, e.g., Ru, Ir, and/or Rh.

For example, the tunnel barrier layer 110 may be formed of, e.g., aluminum oxide or magnesium oxide.

In example embodiments, the second magnetic layer 112 may serve as a free layer having a variable magnetization direction. For example, the second magnetic layer 112 may be formed of a ferromagnetic material, e.g., Fe, Ni, and/or Co.

The upper electrode layer 116 may be formed on the MTJ layer 114. The upper electrode layer 116 may serve as a hard mask for etching the MTJ layer 114 and the lower electrode layer 106.

The upper electrode layer 116 may be formed of, for example, a metal, e.g., tungsten, titanium, or tantalum, or a metal nitride, e.g., tungsten nitride, titanium nitride, or tantalum nitride. In example embodiments, the upper electrode layer 116 may include at least tungsten.

Figure 3:
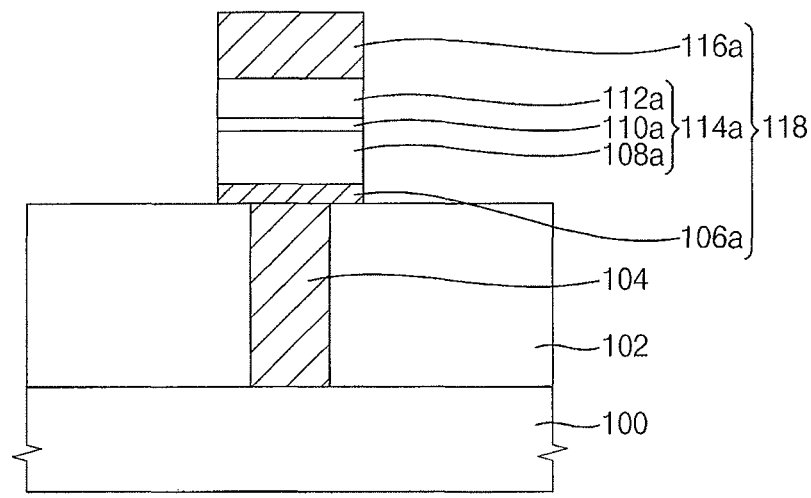

Referring to FIG. 3, an etching mask may be formed on the upper electrode layer 116. The upper electrode layer 116 may be etched using the etching mask to form an upper electrode 116a. The etching mask may include a photoresist pattern or an insulation pattern.

The MTJ layer 114 and the lower electrode layer 116 may be sequentially etched using the upper electrode 116a as an etching mask to form a memory structure 118 including a lower electrode 106a, an MTJ structure 114a, and the upper electrode 116a sequentially stacked on the contact plug 104.

The MTJ structure 114a may include a first magnetic pattern 108a, a tunnel barrier pattern 110a, and a second magnetic pattern 112a sequentially stacked.

The etching process may include a dry etching process, e.g., an ion beam etching, a sputter etching, or a radio-frequency (RF) etching. In an embodiment, the upper electrode layer 116, the MTJ layer 114, and the lower electrode layer 106 may be etched by the ion beam etching process.

In an embodiment, various modifications to compositions of the memory structure 118 may be possible.

In example embodiments, each of sidewalls of the memory structure 118 may have a vertical slope, as shown in FIG. 2. In an embodiment, each of the sidewalls of the memory structure 118 may be inclined, and a vertical cross-section of the memory structure 118 may have a shape of a trapezoid.

Figure 4:
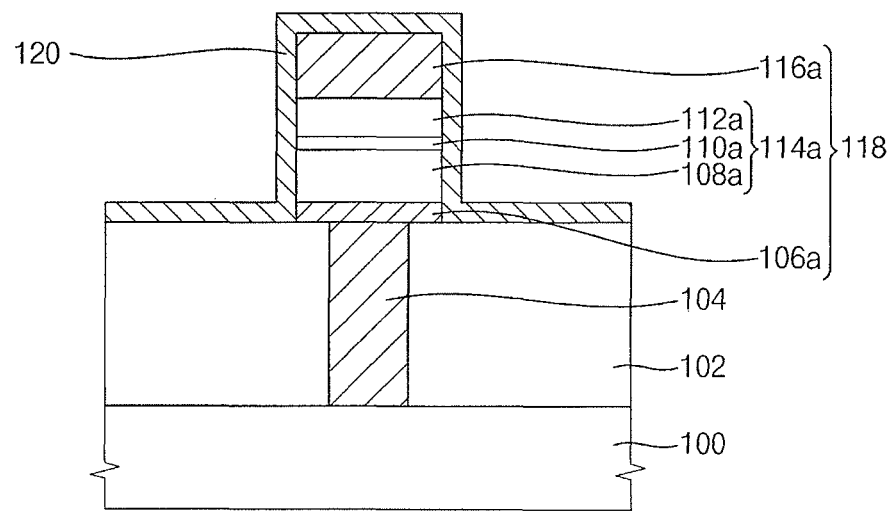
Figure 5:
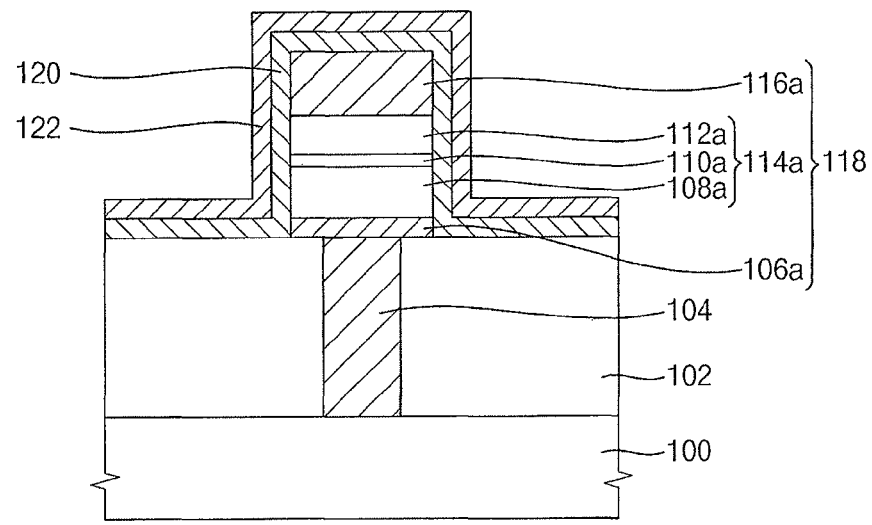

Referring to FIGS. 4 and 5, a first capping layer 120 may be formed on the first insulating interlayer 102 to cover a surface of the memory structure 118. A second capping layer 122 may be formed on the first capping layer 120.

The first and second capping layers 120 and 122 may be formed by a CVD process using plasma. For example, the first and second capping layers 120 and 122 may be formed by a plasma enhanced chemical vapor deposition (PE-CVD) process. Each of the first and second capping layers 120 and 122 may be formed by the CVD process using different plasma types from each other.

The first capping layer 120 may directly contact the surface of the memory structure 118, the surface of the memory structure 118 may be damaged by plasma during forming the first capping layer 120, and in an embodiment, the first capping layer 120 may be formed while reducing the plasma damage of the surface of the memory structure 118.

The second capping layer 122 may have a compactness or density greater than that of the first capping layer 120, and the second capping layer 122 may protect the memory structure 118 during performing subsequent processes. For example, the second capping layer 122 may prevent magnetic materials in the memory structure 118 from being deteriorated due to, for example, a thermal process or penetration of chemicals.

In example embodiments, each of the first and second capping layers 120 and 122 may be formed of nitrogen. The first capping layer 120 may be formed to have a first nitrogen concentration, and the second capping layer 122 may be formed to have a second nitrogen concentration greater than the first nitrogen concentration. As concentrations of nitrogen included in the first and second capping layers 120 and 122 increase, the densities of the first and second capping layers 120 and 122 may increase.

In example embodiments, the first and second capping layers 120 and 122 may be formed in the same chamber in-situ.

In example embodiments, each of the first and second capping layers 120 and 122 may be formed of e.g., silicon nitride, silicon oxynitride, SiCN, SiOCN, or aluminum nitride.

In example embodiments, the first and second capping layers 120 and 122 may include substantially the same elements. In an embodiment, concentrations of the elements included in the first and second capping layers 120 and 122 may be different from each other. In some example embodiments, the first and second capping layers 120 and 122 may include at least one element different from each other.

In example embodiments, the first capping layer 120 may be formed by a first CVD process of a first plasma type using a high-frequency RF power. The second capping layer 122 may be formed by a second CVD process of a second plasma type using a high-frequency RF power and a low-frequency RF power. For example, the high-frequency RF power may be about 13.56 MHz, and the low-frequency RF power may be about 200 kHz to about 400 kHz.

In the first CVD process, a layer may be formed while reducing damage of, e.g., damage to, an underlying layer, in comparison with the second CVD process.

When the low-frequency RF power is further used, ion energy may be increased, bombardment of ions may increase, and the second capping layer 122 formed by the second CVD process may have a density greater than a density of the first capping layer 120 formed by the first CVD process.

In example embodiments, when the first capping layer 120 is formed, the RF power may be periodically and repeatedly provided by a pulsed manner. When the second capping layer 122 is formed, the RF power may be continuously provided by a continuous manner.

When the RF power is provided by the pulsed manner, the density of the layer may be lowered, and the plasma damage to the underlying layer may decrease.

In example embodiments, the first and second capping layers 120 and 122 may be formed using substantially the same source gases, and the source gases may be provided under substantially the same conditions, e.g., same providing conditions. In an embodiment, the first and second capping layers 120 and 122 may be formed using different plasma types from each other, as described above.

In some example embodiments, the first and second capping layers 120 and 122 may be formed using substantially the same source gases. In an embodiment, the source gases may be provided under different conditions, e.g., different providing conditions, from each other. For example, a flow rate of a nitrogen source gas for forming the first capping layer 120 may be less than a flow rate of a nitrogen source gas for forming the second capping layer 122, and the first and second capping layers 120 and 122 may include substantially the same elements. In an embodiment, concentrations of the elements included in the first and second capping layers 120 and 122 may be different from each other.

In some example embodiments, at least one of the source gases for forming the first and second capping layers 120 and 122 may different from each other, and at least one of elements of the first and second capping layers 120 and 122 may be different from each other.

Hereinafter, in example embodiments, a method of forming the first and second capping layers 120 and 122 including silicon nitride will be particularly described with reference to FIG. 7.

A substrate may be loaded on a chuck 30 in a process chamber 10.

Source gases and a dissociation gas may be provided into the process chamber 10 from a gas supply part 50, a high-frequency RF power HF may be provided for the process chamber 10, and the first capping layer 120 may be formed by a first CVD process. In example embodiments, the high-frequency RF power HF may be provided by a pulsed manner. In some example embodiments, the high-frequency RF power HF may be provided by a continuous manner.

The source gases may include, e.g., $NH_3$ and $SiH_4$, and the dissociation gas may include, e.g., $N_2$, and the first capping layer 120 including silicon nitride may be formed.

After forming the first capping layer 120, the second capping layer 122 may be formed on the first capping layer 120 in-situ.

The source gases and dissociation gas may be continuously provided into the process chamber 10 from the gas supply part 50, both of a high-frequency RF power HF and a low-frequency RF power LF may be provided for the process chamber 10, and the second capping layer 122 may be formed by a second CVD process. In example embodiments, each of the high-frequency RF power HF and the low-frequency RF power LF may be provided by a continuous manner.

The source gases may include, e.g., $NH_3$ and $SiH_4$, and the dissociation gas may include, e.g., $N_2$, and the second capping layer 122 including silicon nitride may be formed.

In example embodiments, when the first and second capping layers 120 and 122 are formed, the source gases and dissociation gas may be provided into the process chamber 10 under substantially the same conditions, e.g., same providing conditions. In an embodiment, the second capping layer 122 may be formed using the low-frequency RF power LF, the strength of Si—N bonds in the second capping layer 122 may be increased due to, for example, bombardment of ions, and the second nitrogen concentration of the second capping layer 122 may be greater than the first nitrogen concentration of the first capping layer 120. For example, the first capping layer 120 may include silicon-rich silicon nitride, and the second capping layer 122 may include nitrogen-rich silicon nitride.

In some example embodiments, when the first and second capping layers 120 and 122 are formed, at least one of the source gases and dissociation gas may be provided under different conditions, e.g., different providing conditions from each other. In the deposition process, when a flow rate of a nitrogen source gas, e.g., $NH_3$, is increased, a layer may be formed to be more compact, while an underlying layer may be damaged by plasma. In some example embodiments, a flow rate of NH$_3$ for forming the second capping layer 122 may be greater than a flow rate of NH$_3$ for forming the first capping layer 120.

The second capping layer 122 may have a density higher than a density of the first capping layer 120, and the second capping layer 122 may have an etch resistance greater than an etch resistance of the first capping layer 120.

For example, when the first and second capping layers 120 and 122 including silicon nitride are formed under substantially the same conditions except for the plasma type, the etch rate of the second capping layer 122 may be about 20% to about 50% of the etch rate of the first capping layer 120, when a wet etching process is performed using HF solution diluted about 1:200.

Referring to FIG. 6, a second insulating interlayer 124 may be formed on the second capping layer 122 to cover the memory structure 118.

The second insulating interlayer 124 may be formed of silicon oxide. In example embodiments, an upper surface of the second insulating interlayer 124 may be planarized so as to be flat.

A wiring structure 128 may be formed through the second insulating interlayer 124 and the first and second capping layers 120 and 122 to be electrically connected to the upper electrode 116a.

For example, the second insulating interlayer 124 and the first and second capping layers 120 and 122 may be partially etched to form a trench 126 exposing an upper surface of the upper electrode 116a. A barrier layer may be formed on an inner wall and a bottom of the trench 126, and a metal layer may be formed on the barrier layer to fill the trench 126. The metal layer and the barrier layer may be planarized until the upper surface of the second insulating interlayer 124 may be exposed to form the wiring structure 128. The barrier layer may be formed of, e.g., titanium, titanium nitride, tantalum, or tantalum nitride. The metal layer may be formed of, e.g., tungsten, copper, or aluminum.

When the MRAM is manufactured, the first and second capping layers 120 and 122 may be formed by various methods using different plasma types from each other.

In some example embodiments, the first and second capping layers 120 and 122 may be formed by the first CVD process using a high-frequency RF power. When the first capping layer 120 is formed, the RF power may be periodically and repeatedly provided by the pulsed manner. When the second capping layer 122 is formed, the RF power may be continuously provided by the continuous manner, and plasma damage may decrease during forming the first capping layer 120, and the second capping layer 122 may have a high density.

In some example embodiments, the first and second capping layers 120 and 122 may be formed by the second CVD process using both of a high-frequency RF power and a low high-frequency RF power. When the first capping layer 120 is formed, the RF power may be provided by the pulsed manner. When the second capping layer 122 is formed, the RF power may be provided by the continuous manner, and plasma damage may decrease during forming the first capping layer 120, and the second capping layer 122 may have a high density.

Methods of forming the first and second capping layers 120 and 122 of the MRAM device have been illustrated. In an embodiment, the first and second capping layers 120 and 122 may be formed in various memory devices for encapsulating or capping patterns by the above illustrated processes. For example, the first and second capping layers 120 and 122 may be formed to cover a surface of a GST (Ge$_2$Sb$_2$Te$_5$) pattern, which may be a phage-change pattern of a phase-change random access memory (PRAM), by the above illustrated processes.

Figure 8:
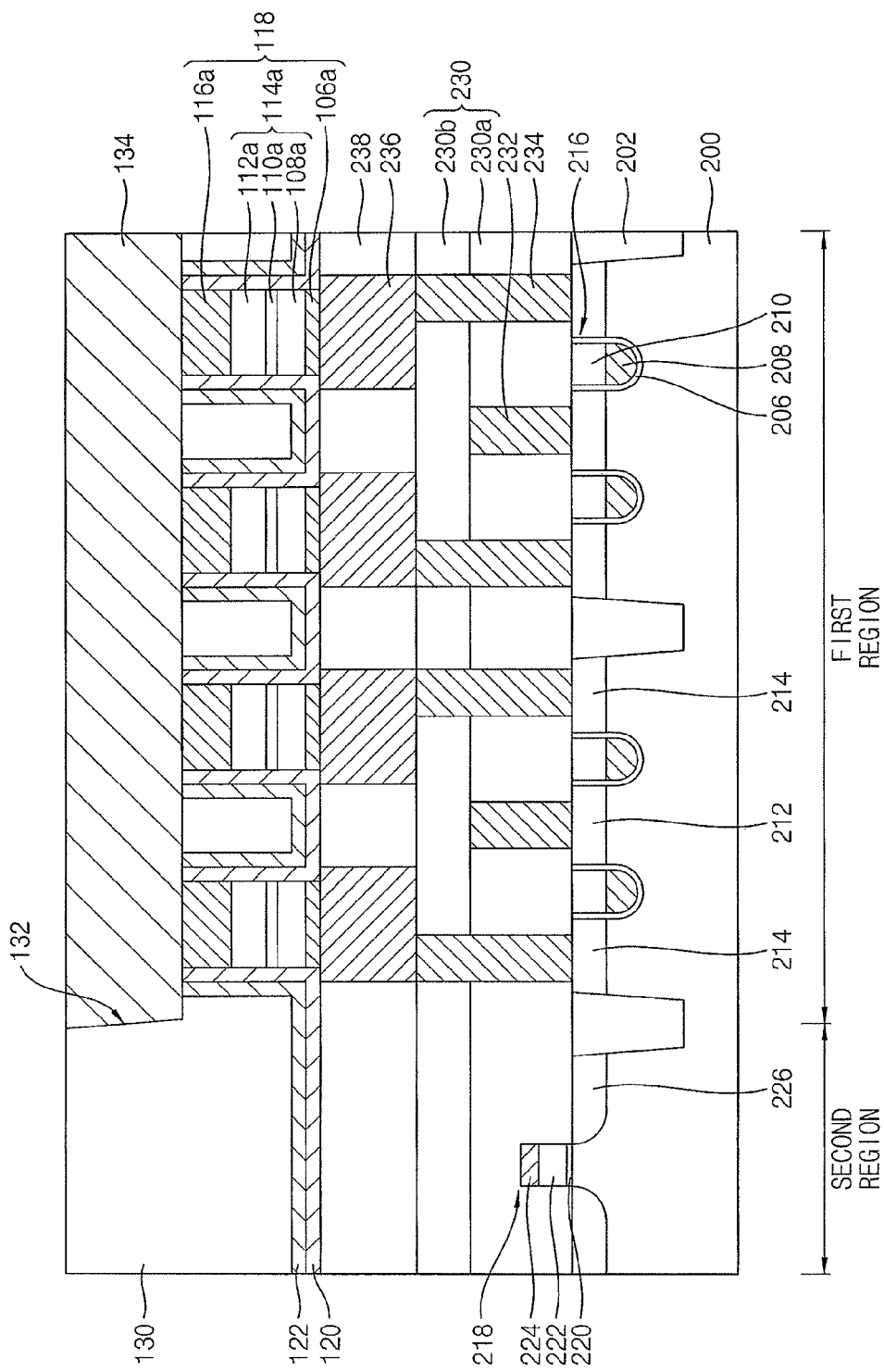
FIG. 8 illustrates a cross-sectional view of an MRAM device in accordance with example embodiments.

FIG. 8 illustrates a cross-sectional view of an MRAM device in accordance with example embodiments. Referring to FIG. 8, a substrate 200 may include a first region and a second region. The first region may be a cell region for forming memory cells of the MRAM device. The second region may be a peripheral region for forming peripheral circuits of the MRAM device. Each of the first and second regions may include an active region 305 and a field region.

In the first region, a plurality of active regions may be spaced apart from each other. First transistors 216 may be formed at each of the active regions. In example embodiments, two first gate structures may be formed at each of the active regions, and two first transistors 216 may be formed within each of the active regions. A central portion of each of the active regions may serve as a first source region 212, and edge portions of each of the active regions may serve as first drain regions 214. The first source region 212 may serve as a common source region of the two first transistors 216. The first transistors 216 may be buried channel array transistors (BCATs), and the first gate structure may be formed in a trench of the substrate 200, and may include a first gate insulation pattern 206, a first gate electrode 208, and a first hard mask 210. The first gate structure may extend in a first direction.

In some example embodiments, the first transistors 216 may be planar-type channel array transistors (PCATs) each including the first gate structure on the substrate 200.

A source line 232 may extend in the first direction on the first source region 212. The source line 232 may include, for example, a metal, e.g., tungsten, titanium, or tantalum, and/or a metal nitride, e.g., tungsten nitride, titanium nitride, or tantalum nitride.

A second transistor 218 may be formed in the second region of the substrate 200, and may form the peripheral circuits. The second transistor 218 may be a PCAT. The second transistor 218 may include a second gate insulation pattern 220, a second gate electrode 222, a second hard mask 224, and second source/drain regions 226.

A first insulating interlayer structure 230 may be formed on the first and second regions of the substrate 200. The first insulating interlayer structure 230 may sufficiently cover the source line 232 and the first and second transistors 216 and 218. The first insulating interlayer structure 230 may have a first upper surface, which may be flat, and the first upper surface of the first insulating interlayer structure 230 may be higher than an upper surface of the source line 232. In example embodiments, the first insulating interlayer structure 230 may include a first lower insulating interlayer 230a and a second lower insulating interlayer 230b. The source line 232 may be formed through the first lower insulating interlayer 230a.

Contact plugs 234 may contact the first drain regions 214 through the first insulating interlayer structure 230 in the first region. For example, the contact plugs 234 may penetrate through the first and second lower insulating interlayers 230a and 230b. A top surface of each of the contact plugs 234 may be higher than a top surface of the source line 232.

Pad patterns 236 may be formed on the contact plugs 234, respectively. An insulation pattern 238 may be formed on the first insulating interlayer 230 between the pad patterns 236. The pad patterns 236 may electrically connect the contact plugs 234 and memory structures 118, respectively, when the contact plugs 234 and the memory structures 118 do not directly contact to each other. In some example embodiments, no pad patterns may be formed when the contact plugs 234 and the memory structures 118 directly contact to each other.

The memory structures 118 may be formed on the pad patterns 236, respectively. Each of the memory structures 118 may include a lower electrode 106a, an MTJ pattern 114a, and an upper electrode 116a sequentially stacked. The memory structure 118 may be substantially the same as or similar to the memory structure illustrated with reference to FIG. 1.

A first capping layer 120 may be conformally formed on the insulation pattern 238, the pad patterns 236, and the memory structures 118. The first capping layer 120 may cover the memory structure 118. A second capping layer 122 may be formed on the first capping layer 120.

The first capping layer 120 may directly contact the surface of the memory structure 118. The first capping layer 120 may be formed while reducing the plasma damage to the surface of the memory structure 118.

The second capping layer 122 may have a density higher than a density of the first capping layer 120, and the second capping layer 122 may protect the memory structure 118 during subsequent processes.

The first and second capping layers 120 and 122 may include nitrogen. The first capping layer 120 may have a first nitrogen concentration, and the second capping layer 122 may have a second nitrogen concentration greater than the first nitrogen concentration.

In example embodiments, the first and second capping layers 120 and 122 may be substantially the same as or similar to the first and second capping layers illustrated with reference to FIG. 1, respectively.

A second insulating interlayer 130 may be formed on the first and second capping layers 120 and 122, and may cover the memory structures 118. The second insulating interlayer 130 may include, e.g., silicon oxide.

A bit line 134 may be formed through the second insulating interlayer 130, and may contact a top surface of the upper electrode 116a. The bit line 134 may contact a plurality of upper electrodes 116a, and extend in a second direction substantially perpendicular to the first direction. In example embodiments, a plurality of bit lines 134 may be formed to be parallel to each other.

Each of the bit lines 134 may include a barrier pattern and a metal pattern substantially stacked. The barrier pattern may include, for example, a metal, e.g., titanium, or tantalum, and/or a metal nitride, e.g., titanium nitride, or tantalum nitride. The metal pattern may include, e.g., Cu, W, or Al.

Top surfaces of the bit lines 134 and the second insulating interlayer 130 may be substantially coplanar with each other. A third insulating interlayer may be further formed to cover the second insulating interlayer 130 and the bit lines 134.

Figure 9:
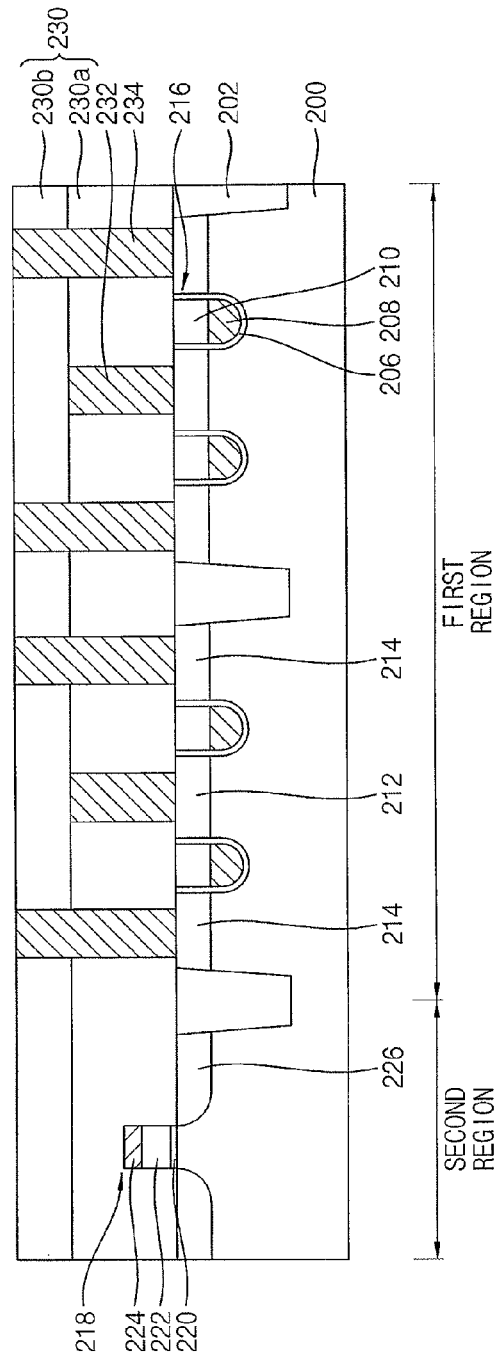
FIGS. 9 to 14 illustrate cross-sectional views of stages of a method of manufacturing the MRAM device in accordance with example embodiments.

FIGS. 9 to 14 illustrate cross-sectional views of stages of a method of manufacturing an MRAM device in accordance with example embodiments. Referring to FIG. 9, an isolation layer 202 may be formed on a substrate 200, and the substrate 200 may be divided into a field region on which the isolation layer 202 is formed and an active region on which no isolation layer is formed. The substrate 200 may include a first region in which memory cells may be formed and a second region in which peripheral circuits may be formed. The isolation layer 202 may be formed by a shallow trench isolation (STI) process. In example embodiments, a plurality of active regions may be spaced apart from each other.

First transistors 216 may be formed on the first region of the substrate 200. Two first transistors 216 may be formed within each of the active regions. In example embodiments, the first transistors 216 may be BCATs. For example, a mask may be formed on the substrate 200, and an upper portion of the substrate 200 may be etched using the mask as an etching mask to form trenches extending in a first direction. Two trenches may be formed within each of the active regions. A first gate structure may be formed in each of the trenches, and the first gate structure may be formed to include a first gate insulation pattern 206, a first gate electrode 208, and a first hard mask 210. The active region adjacent to the first gate structure may be doped with impurities to form a first source region 212 and first drain regions 214. The first source region 212 may serve as a common source region of the two first transistors 216 within each of the active regions.

In an embodiment, the first transistors 216 may be PCATs.

A second transistor 218 may be formed on the second region of the substrate 200. In example embodiments, the second transistor 218 may be a PCAT. For example, a gate insulation layer, a gate electrode layer and a second hard mask 224 may be sequentially formed on the substrate 200, and the gate electrode layer and a gate insulation layer may be etched using the second hard mask 224 as an etching mask to form a second gate electrode 222 and a second gate insulation pattern 220, respectively. The active region adjacent to the second gate electrode 222 may be doped with impurities to form second source/drain regions 226.

A first lower insulating interlayer 230a may be formed on the first and second regions of the substrate 200 to cover the first and second transistors 216 and 218. The first lower insulating interlayer 230a may be planarized, and an upper surface of the first lower insulating interlayer 230a may be flat. In example embodiments, the planarization process may be performed by a chemical mechanical polishing (CMP) process and/or an etch back process.

A portion of the first lower insulating interlayer 230a may be etched to form a first opening, which may expose a top surface of the first source region 212. The first opening may extend in the first direction. A first conductive layer may be formed on the exposed top surface of the first source region 212 and the first lower insulating interlayer 230a to sufficiently fill the first opening, and may be planarized until the upper surface of the first lower insulating interlayer 230a may be exposed to form a source line 232 contacting the first source region 212. The source line 232 may be formed of, for example, a metal, e.g., tungsten, titanium, or tantalum, and/or a metal nitride, e.g., tungsten nitride, titanium nitride, or tantalum nitride.

A second lower insulating interlayer 230b may be formed on the first lower insulating interlayer 230a and the source line 232. The first lower insulating interlayer 230a may have a flat top surface, and the second lower insulating interlayer 230b may also have a flat top surface. The first and second lower insulating interlayers 230a and 230b may be formed of, e.g., silicon oxide.

The second and first lower insulating interlayers 230b and 230a may be partially etched to form second openings therethrough exposing top surfaces of the first drain regions 214, respectively. A second conductive layer may be formed on the exposed top surfaces of the first drain regions 214 and the second lower insulating interlayer 230b to sufficiently fill the second openings, and may be planarized until the upper surface of the second lower insulating interlayer 230b may be exposed to form contact plugs 234 contacting the first drain regions 214, respectively. The contact plugs 234 may be formed of, for example, a metal, e.g., tungsten, titanium, or tantalum, and/or a metal nitride, e.g., tungsten nitride, titanium nitride, or tantalum nitride.

The first and second lower insulating interlayers 230a and 230b may form a first insulating interlayer structure 230. The first insulating interlayer structure 230 may be formed on the first and second regions of the substrate 200. The contact plugs 234 and the source line 232 may be formed through the first insulating interlayer structure 230 of the first region. The contact plugs 234 may have a top surface higher than that of the source line 232.

Figure 10:
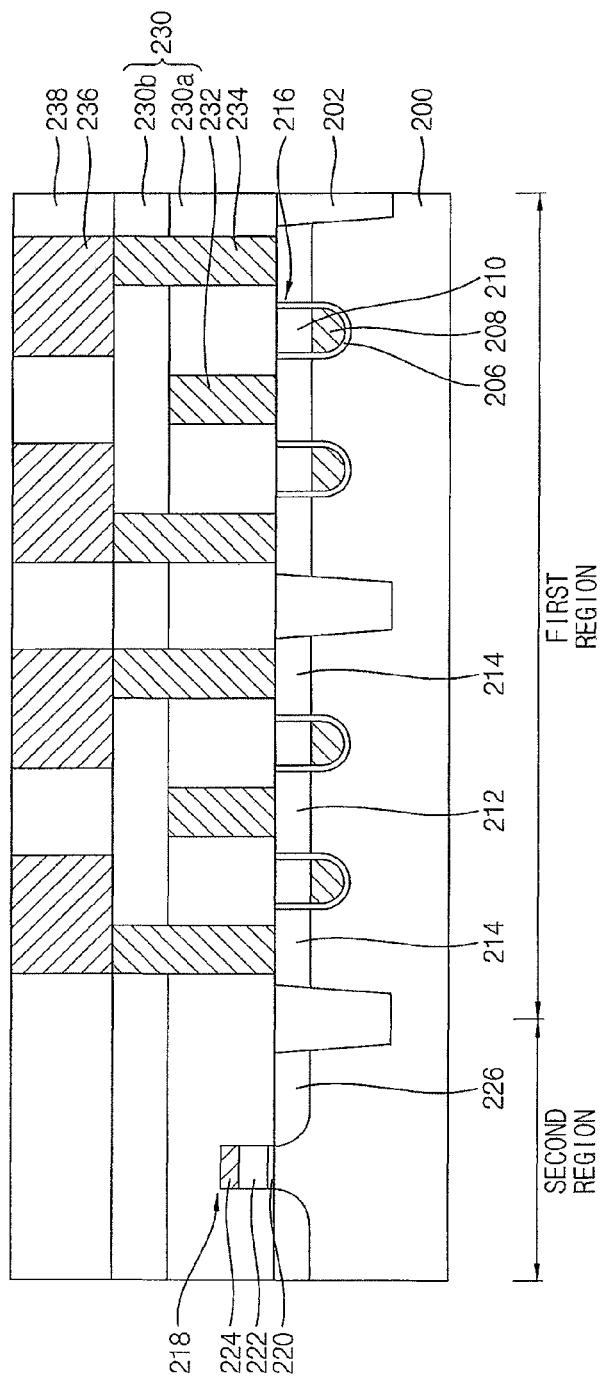

Referring to FIG. 10, a pad layer may be formed on the first insulating interlayer 230 and the contact plugs 234. The pad layer may be formed of, for example, a metal, e.g., tungsten, titanium, or tantalum, and/or a metal nitride, e.g., tungsten nitride, titanium nitride, or tantalum nitride. The pad layer may be patterned to form pad patterns 236 on the contact plugs 234, respectively.

An insulation pattern 238 may be formed on the second lower insulating interlayer 230b to fill a gap between the pad patterns 236. The insulation pattern 238 may be formed of, e.g., silicon nitride or silicon oxide.

In an embodiment, the pad patterns 236 may be formed by a damascene process. Firstly, an insulation pattern 238 including openings, each of which may correspond to positions of pad patterns, may be formed, and a pad layer may be formed to fill the openings. An upper portion of the pad layer may be planarized until a top surface of the insulation pattern 238 may be exposed to form the pad patterns 236. The insulation pattern 238 may be formed of, e.g., silicon nitride or silicon oxide.

Figure 11:
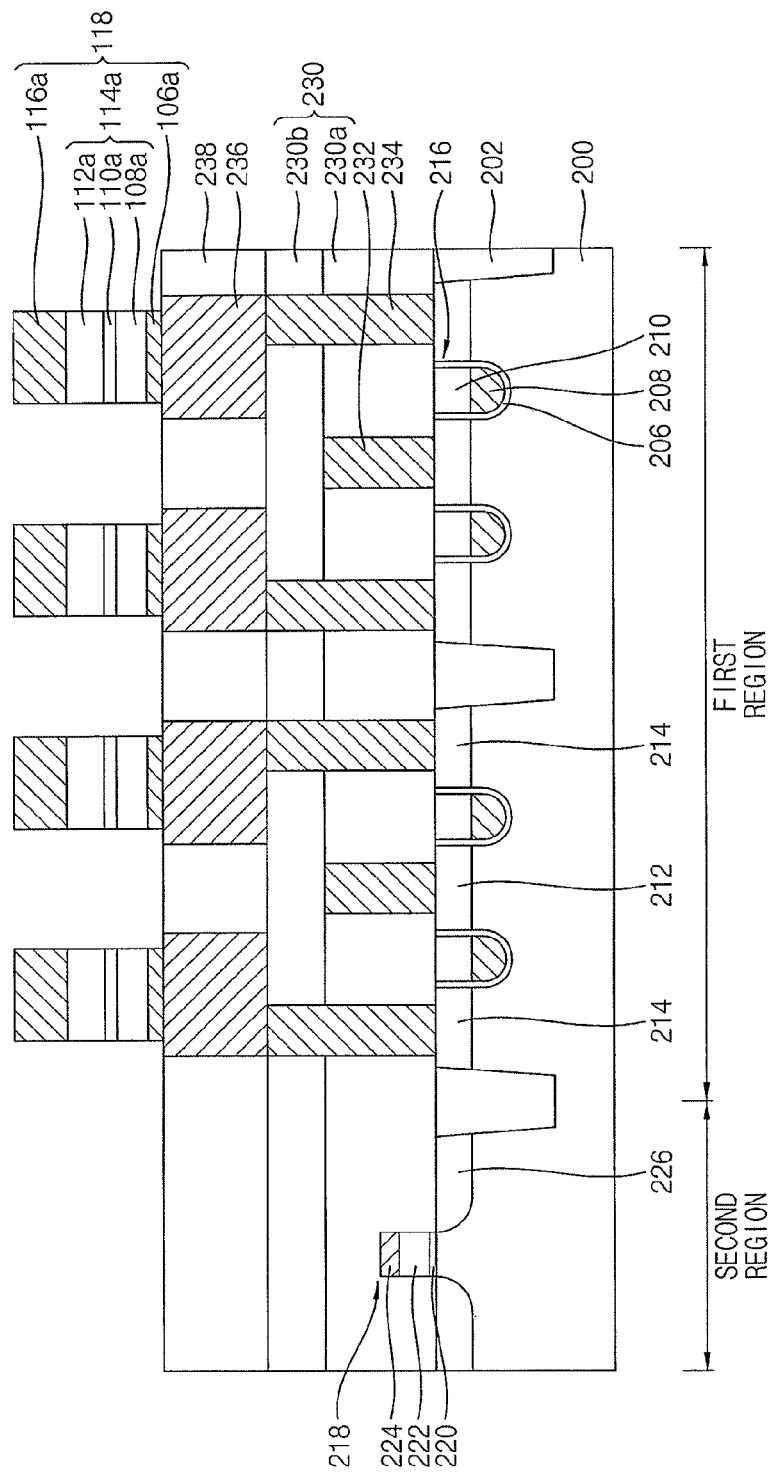

Referring to FIG. 11, a memory structure 118 having a pillar shape may be formed on each of the pad patterns 236. The memory structure 118 may include a lower electrode 106a, an MTJ pattern 114a, and an upper electrode 116a sequentially stacked. In example embodiments, the memory structure 118 may be formed by performing processes substantially the same as those illustrated with reference to FIGS. 2 and 3.

Figure 12:
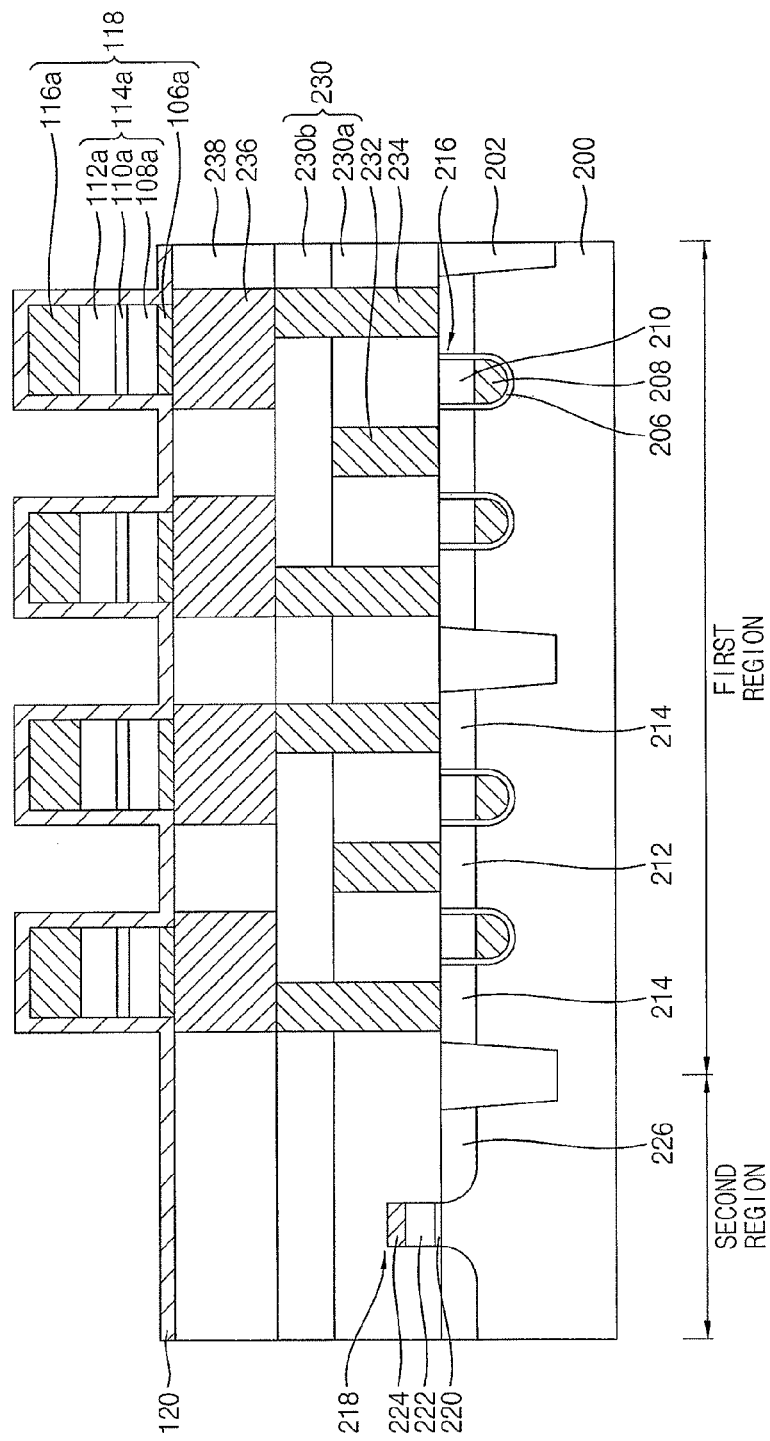
Figure 13:
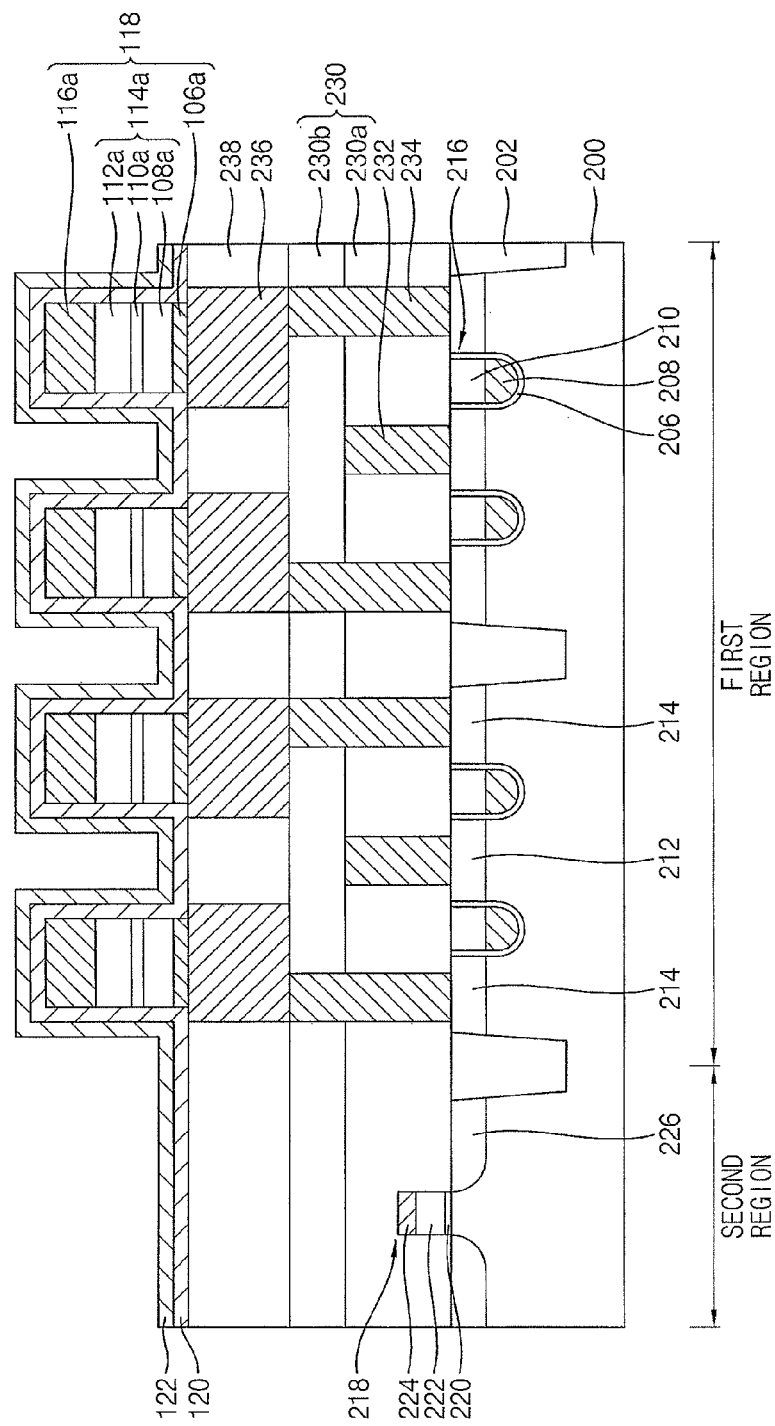

Referring to FIGS. 12 and 13, a first capping layer 120 may be conformally formed on the insulation pattern 238, the pad patterns 236, and the memory structures 118 to cover surfaces of the memory structures 118. A second capping layer 122 may be conformally formed on the first capping layer 120. The first and second capping layers 120 and 122 may not completely fill a space between the memory structures 118.

The first and second capping layers 120 and 122 may be formed by a CVD process using plasma. For example, the first and second capping layers 120 and 122 may be formed by a PE-CVD process. Each of the first and second capping layers 120 and 122 may be formed by the CVD process using different plasma types from each other.

The first capping layer 120 may be formed while reducing the plasma damage of the surface of the memory structure 118. The second capping layer 122 may have a density greater than a density of the first capping layer 120, and the second capping layer 122 may protect the memory structure 118 during performing subsequent processes.

In example embodiments, the first capping layer 120 may be formed by a first CVD process of a first plasma type using a high-frequency RF power. The second capping layer 122 may be formed by a second CVD process of a second plasma type using a high-frequency RF power and a low-frequency RF power.

The first and second capping layers 120 and 122 may be formed by performing processes substantially the same as those illustrated with reference to FIGS. 4 and 5.

In some example embodiments, the first and second capping layers 120 and 122 may be formed by the first CVD process using a high-frequency RF power. When the first capping layer 120 is formed, the RF power may be periodically and repeatedly provided by a pulsed manner. When the second capping layer 122 is formed, the RF power may be continuously provided by a continuous manner.

In some example embodiments, the first and second capping layers 120 and 122 may be formed by the second CVD process using both of a high-frequency RF power and a low high-frequency RF power. When the first capping layer 120 is formed, the RF power may be provided by a pulsed manner. When the second capping layer 122 is formed, the RF power may be provided by a continuous manner.

Plasma damage and deterioration due to, for example, a thermal process of the memory structure 118, may be decreased by the first and second capping layers 120 and 122.

Figure 14:
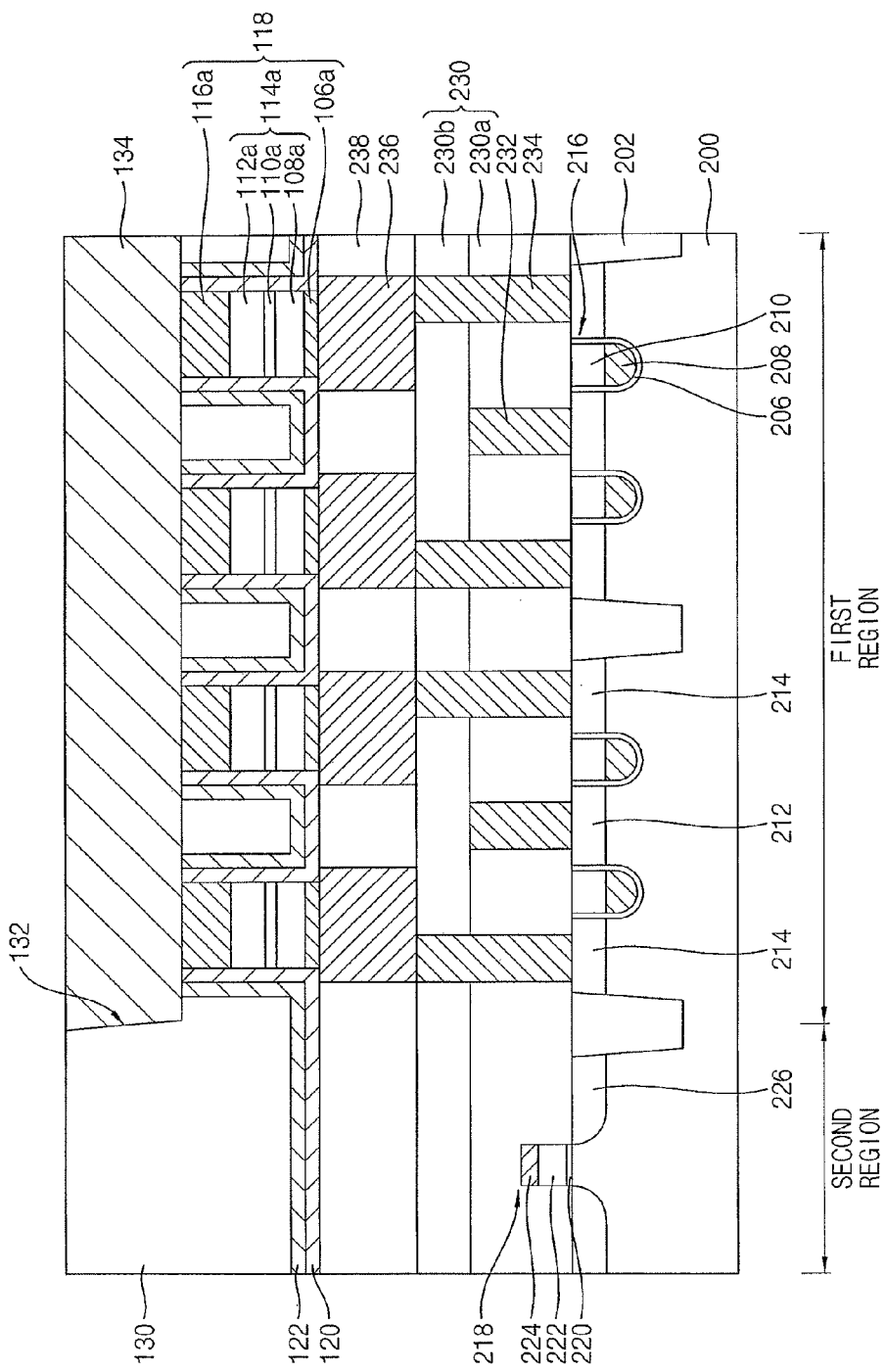

Referring to FIG. 14, a second insulating interlayer 130 may be formed on the second capping layer 122 to cover the memory structures 118. The second insulating interlayer 130 and the first and second capping layers 120 and 122 may be partially etched to form a trench 132, and an upper surface of the upper electrode 116a may be exposed by the trench 132. A bit line 134 may be formed in the trench 132.

The second insulating interlayer 130 may be formed of, e.g., silicon oxide. In example embodiments, an upper surface of the second insulating interlayer 130 may be further planalized, and the upper surface of the second insulating interlayer 130 may have flat.

The trench 132 may be formed to extend in the second direction.

The bit line 134 may be formed by forming a barrier layer on a sidewall and a bottom surface of the trench 132, forming a metal layer on the barrier layer to fill the trench 132, and planalizing upper surfaces of the metal layer and the barrier layer until the upper surface of the second insulating interlayer 130 may be exposed. The barrier layer may be formed of for example, a metal, e.g., titanium, or tantalum, and/or a metal nitride, e.g., titanium nitride, or tantalum nitride. The metal layer may be formed of, e.g., Cu, W, or Al, and the bit line 134 may include a barrier pattern and a metal pattern. The bit line 134 may contact the upper electrode 116a.

A third insulating interlayer may be further formed to cover the second insulating interlayer 130 and the bit line 134.

The MRAM device according to example embodiments may be used in various types of electronic devices, e.g., mobile devices, memory cards, and computers.

By way of summation and review, in an MRAM device, each of memory cells may include a lower electrode, an MTJ structure, and an upper electrode sequentially stacked. A capping layer may be formed on the MTJ structure, and characteristics of a magnetic material may not be changed during performing subsequent processes.

The capping layer may be formed by a PE-CVD process. However, when the capping layer is formed on the MTJ structure, the magnetic material in the MTJ structure may be deteriorated by a plasma. If a compactness (or density) of the capping layer is less, the MTJ may be deteriorated due to, for example, a subsequent thermal process or penetration of chemicals.

In embodiments, a first and second capping layer may be formed on the memory structure, and the first and second capping layer may be formed by a CVD process using different plasma types from each other. The first capping layer may be formed while reducing the plasma damage of the surface of the memory structure. The second capping layer may be formed to have a density greater than a density of the first capping layer, the surface of the memory structure may be protected by the first and second capping layers, and damage of, e.g., damage to, the surface of the memory structure may be reduced.

The first and second capping layers may be formed in the same chamber in-situ. For example, the first capping layer may be formed using a high-frequency RF power, and the second capping layer may be formed using a high-frequency RF power and a low-frequency RF power. In an embodiment, the first capping layer may be formed using an RF power provided by a pulsed manner, and the second capping layer may be formed using an RF power provided by a continuous manner.

Example embodiments may provide a method of manufacturing an MRAM device having good characteristics. Example embodiments may provide an MRAM device having good characteristics. Example embodiments relate to magnetoresistive random access memory devices and methods of manufacturing the same.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a memory device, the method comprising:
    forming a memory structure on a substrate, the memory structure including a lower electrode, a magnetic tunnel junction structure, and an upper electrode sequentially stacked;
    forming a first capping layer to cover at least a side surface of the memory structure by a deposition process using a plasma under first conditions;
    forming a second capping layer on the first capping layer covering the side surface of the memory structure by a deposition process using a plasma under second conditions different from the first conditions;
    forming an insulating interlayer on the second capping layer; and
    forming a wiring through the insulating interlayer to be electrically connected to the upper electrode.

2. The method as claimed in claim 1, wherein:
    the first capping layer is formed by a first chemical vapor deposition process using a first frequency power, and
    the second capping layer is formed by a second chemical vapor deposition process using both of the first frequency power and a second frequency power lower than the first frequency power.

3. The method as claimed in claim 2, wherein:
    the first capping layer is formed using a radio-frequency power provided by a pulsed manner, and
    the second capping layer is formed using a radio-frequency power by a continuous manner.

4. The method as claimed in claim 2, wherein each of the first and second capping layers is formed using a radio-frequency power provided by a continuous manner.

5. The method as claimed in claim 1, wherein:
    the first and second capping layers are formed by a chemical vapor deposition process using a first frequency power,
    the first capping layer is formed using a radio-frequency power provided by a pulsed manner, and
    the second capping layer is formed using a radio-frequency power by a continuous manner.

6. The method as claimed in claim 1, wherein:
    the first and second capping layers are formed by a chemical vapor deposition process using both of a first frequency power and a second frequency power lower than the first frequency power,
    the first capping layer is formed using a radio-frequency power provided by a pulsed manner, and
    the second capping layer is formed using a radio-frequency power provided by a continuous manner.

7. The method as claimed in claim 1, wherein the first and second capping layers are formed in a same process chamber in-situ.

8. The method as claimed in claim 1, wherein:
    the first capping layer has a first nitrogen concentration, and
    the second capping layer has a second nitrogen concentration greater than the first nitrogen concentration.

9. The method as claimed in claim 1, wherein:
    the first and second capping layers are formed using substantially same source gases, and
    the substantially same source gases are provided under substantially same conditions.

10. The method as claimed in claim 1, wherein the first and second capping layers are formed using substantially same source gases provided under different conditions from each other.

11. The method as claimed in claim 10, wherein:
    the substantially same source gases include at least nitrogen gas, and
    a flow rate of a first nitrogen gas for forming the first capping layer is lower than a flow rate of a second nitrogen gas for forming the second capping layer.

12. The method as claimed in claim 1, wherein each of the first and second capping layers includes silicon nitride, silicon oxynitride, SiCN, SiOCN, or aluminum nitride.

13. The method as claimed in claim 1, wherein the second capping layer is formed conformally and directly on the first capping layer.

14. The method as claimed in claim 1, wherein:
    the first capping layer and the second capping layer include first and second elements, and
    a ratio of the first and second elements of the first capping layer is different from a ratio of the first and second elements of the second capping layer.

15. The method as claimed in claim 1, wherein an etching resistance of the second capping layer is greater than that of the first capping layer.

16. A method of manufacturing a memory device, the method comprising:
    forming a memory structure on a substrate, the memory structure including a lower electrode, a magnetic tunnel junction structure, and an upper electrode sequentially stacked;
    forming a first capping layer to cover at least a side surface of the memory structure by a deposition process using a first frequency power; and forming a second capping layer on the first capping layer covering the side surface of the memory structure by a deposition process using both of the first frequency power and a second frequency power lower than the first frequency power;

forming an insulating interlayer on the second capping layer; and forming a wiring through the insulating interlayer to be electrically connected to the upper electrode.

17. The method as claimed in claim 16, wherein the first and second capping layers are formed in a same process chamber in-situ.

18. The method as claimed in claim 16, wherein:
the first capping layer is formed using a radio-frequency power provided by a pulsed manner, and
the second capping layer is formed using a radio-frequency power provided by a continuous manner.

19. The method as claimed in claim 16, wherein the first and second capping layers are formed using a radio-frequency power provided by a continuous manner.

20. The method as claimed in claim 16, wherein:
the first capping layer has a first nitrogen concentration, and
the second capping layer has a second nitrogen concentration greater than the first nitrogen concentration.

21. The method as claimed in claim 16, wherein each of the first and second capping layers includes silicon nitride, silicon oxynitride, SiCN, SiOCN, or aluminum nitride.

22. A method of manufacturing a memory device, the method comprising:

forming a memory structure on a substrate, the memory structure including a lower electrode, a magnetic tunnel junction structure, and an upper electrode sequentially stacked;

forming a first capping layer to cover at least a side surface of the memory structure; and forming a second capping layer on the first capping layer covering the side surface of the memory structure, a density of the second capping layer being greater than a density of the first capping layer;

forming an insulating interlayer on the second capping layer; and forming a wiring through the insulating interlayer to be electrically connected to the upper electrode.

* * * * *